(12) United States Patent
Brillhart

(10) Patent No.: US 6,475,830 B1
(45) Date of Patent: Nov. 5, 2002

(54) FLIP CHIP AND PACKAGED MEMORY MODULE

(75) Inventor: Mark Brillhart, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/618,975

(22) Filed: Jul. 19, 2000

(51) Int. Cl.⁷ .................. H01L 21/44; H01L 21/48; H01L 21/50; H01L 23/34; H01L 23/48; H01L 23/52; H01L 29/40

(52) U.S. Cl. .................. 438/109; 257/724; 257/777

(58) Field of Search .................. 438/109; 257/777, 257/724

(56) References Cited

U.S. PATENT DOCUMENTS

| | | | |
|---|---|---|---|
| 4,660,069 A | 4/1987 | Kochanski et al. | 257/724 |
| 4,935,856 A | 6/1990 | Dragoon | 362/307 |
| 5,130,761 A | 7/1992 | Tanaka | 357/17 |
| 5,386,567 A | 1/1995 | Lien et al. | 395/700 |
| 5,412,538 A | 5/1995 | Kikinis et al. | 361/792 |
| 5,615,089 A | 3/1997 | Yoneda et al. | 361/764 |
| 5,631,497 A | 5/1997 | Miyano et al. | 257/668 |
| 5,717,359 A | 2/1998 | Matsui et al. | 327/565 |
| 5,731,633 A | 3/1998 | Clayton | 257/723 |
| 5,744,862 A | 4/1998 | Ishii | 257/693 |
| 5,831,833 A | 11/1998 | Shirakawa et al. | 361/762 |
| 5,943,216 A | 8/1999 | Schmidt | 361/761 |
| 5,976,953 A * | 11/1999 | Zavracky et al. | 438/455 |
| 6,087,723 A * | 7/2000 | Kinsman et al. | 257/727 |
| 6,127,726 A * | 10/2000 | Bright et al. | 257/691 |
| 6,143,590 A * | 11/2000 | Ohki et al. | 438/122 |
| 6,159,767 A * | 12/2000 | Eichelberger | 438/107 |
| 6,207,478 B1 * | 3/2001 | Chung et al. | 438/124 |

* cited by examiner

Primary Examiner—Tuan H. Nguyen
Assistant Examiner—Nema Berezny
(74) Attorney, Agent, or Firm—Thelen Reid & Priest LLP; David B. Ritchie

(57) ABSTRACT

A multi-chip, module (MCM) having one or more high value chips such as ASICs, CPUs, DSPs or the like attached to the MCM substrate via a direct attach technology (such as flip chip) and one or more memory chips attached to the MCM substrate via a reworkable technology such as connector and receptacle-based package, wirebond package, chip scale package (CSP), leaded package, ball grid array package, or fine pitch ball grid array package. The MCM substrate may, in turn, be attached to a motherboard via solder balls (ball grid array); leads and/or connector interconnect technologies (such as compression sockets).

15 Claims, 5 Drawing Sheets

FLIP CHIP AND PACKAGED MEMORY MODULE

BACKGROUND OF THE INVENTION

1. Field of the Invention

The present invention is directed to Multi-Chip Modules (MCMs) incorporating one or more ASICs (Application Specific Integrated Circuits), CPUs (Central Processing Units), DSPs (Digital Signal Processors) or other high value devices as well as one or more supporting memory devices.

2. Background Art

When attaching chips to a substrate a number of options are available. A common approach is to "package" the chip, i.e., to provide it with an intermediate substrate and connect conductive pins of the chips to conductive attachment points of the package, which can then be attached to a motherboard or similar substrate.

One type of chip package is known as a wirebond BGA package. In a wirebond BGA package a chip is attached via wirebond to an intermediate substrate. The intermediate substrate is attached, in turn, to a motherboard using bull grid array technology. Another type of chip package is known as flip chip BGA (BGA) or fine pitch flip chip BGA (FPBGA). Fine pitch BGA is defined as a pitch (center to center of the solder balls) less than 1 mm.). In this type of package the bare chip is provided with solder balls at its conductive pins, flipped over, and soldered directly via these solder balls to a land grid array of conductive pads on an intermediate substrate. A heat activated epoxy underfill is normally injected between the bare chip and the substrate to relieve stress. The intermediate substrate is then attached using BGA technology to a motherboard or another intermediate substrate.

Another type of chip package is known as leaded package. In this type of package leads at the periphery of the package can be soldered directly to electrical contacts of an intermediate substrate or directly to a motherboard. Leaded packages offer less density of electrical interconnections than the array type packages discussed above. Finally, chip scale packages or CSPs are available which have approximately the same areal size as bare die parts but also have the handling and testability characteristics of packaged devices. These CSPs are similar to flip chip BGA and FPBGA packages in that they have intermediate substrates, usually of a plastic film such as a polyimide which, in turn, support BGA or FPBGA used to attach the CSP to another substrate such as a motherboard.

In the past many manufacturers have attempted to place multiple chips on one module which can then, in turn, be attached to a circuit board. This approach is known as a multi-chip module or MCM. In one embodiment this is done by directly attaching the chips to a substrate and then attaching the substrate to a motherboard such as a printed circuit board PCB. A common application is to attach one or more or a combination of ASICs, CPUs, DSPs or other high value semiconductor integrated circuit devices along with one or more supporting memory chips to a substrate.

In flip chip direct attach technology as practiced today and illustrated in FIGS. 1A, 1B and 1C, a chip 10 is provided with small solder balls 12 on one surface 14. The chip is "flipped" so that surface 14 faces the mounting surface 16 of PCB 18. On mounting surface 16 of PCB 18 is located a land grid array 20 of pads 22 which mate with solder balls 12. The solder balls are heated so that they reflow forming an electrical and physical connection between chip 10 and PCB 18 as shown in FIG. 1B. Finally a filler material 24 (usually a heat curable epoxy) is injected between chip 10 and PCB 18 so that the relative stresses caused by different coefficients of thermal expansion (CTEs) in the chip and the PCB are relieved, avoiding stress failure and fatigue in the solder connections formed by the reflowed solder balls 12. As shown in FIG. 1B, optionally a stiffener ring 19 capped with a heat slug 21 and thermally coupled to chip 10 with thermal grease (not shown) may be used to improve heat dissipation from the chip 10.

The main drawback to using direct attach technology with MCMs including memory chips is the lack of reworkability of the memory chips, which tend to fail the most often. If one of the memory chips fails during testing then the entire module, including the costly ASICs, CPUs, DSPs or other high value devices, must be scrapped since the epoxy filler material cannot easily be removed due to the epoxy underfill. It would, therefore, be desirable to provide a MCM where the high value device is attached via direct attach technology such as flip chip while the memory chips are attached using a reworkable technology so that if the module fails under test due to a memory chip problem, the memory chips can be reworked (i.e., removed and replaced) without scrapping the entire module.

SUMMARY OF THE INVENTION

A multi-chip, module (MCM) having one or more high value chips such as ASICs, CPUs, DSPs or the like attached to the MCM substrate via a direct attach technology (such as flip chip) and one or more memory chips attached to the MCM substrate via a reworkable technology such as connector and receptacle-based package, wirebond package, chip scale package (CSP), leaded package, ball grid array package, or fine pitch ball grid array package is disclosed. The MCM substrate may, in turn, be attached to a motherboard via solder balls (ball grid array), leads and/or connector interconnect technologies (such as compression sockets).

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 1A:
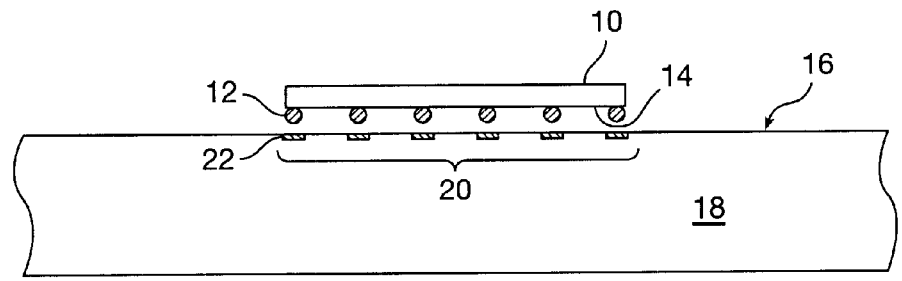
FIG. 1A is a cross-sectional elevational drawing of a flip-chip type connection in accordance with the prior art.
Figure 1B:
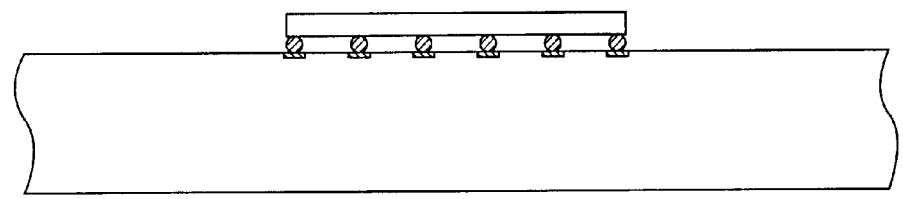
FIG. 1B is a cross-sectional elevational drawing of a flip-chip type connection in accordance with the prior art.
Figure 1C:
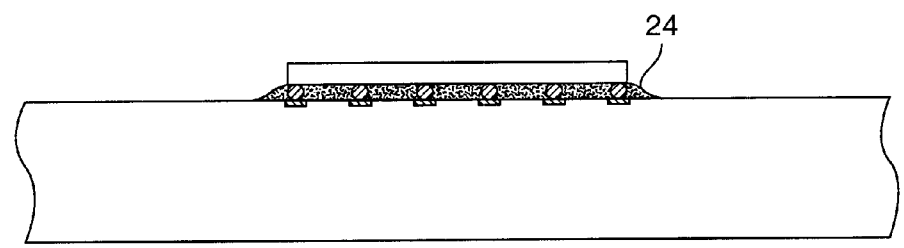
FIG. 1C is a cross-sectional elevational drawing of a flip-chip type connection in accordance with the prior art.
Figure 1D:
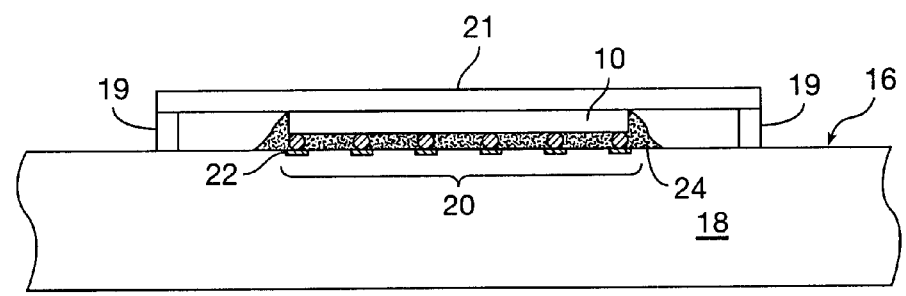
FIG. 1D is a cross-sectional elevational drawing of the apparatus of FIG. 1C further including a stiffener ring and a heat slug in accordance with the prior art.
Figure 2:
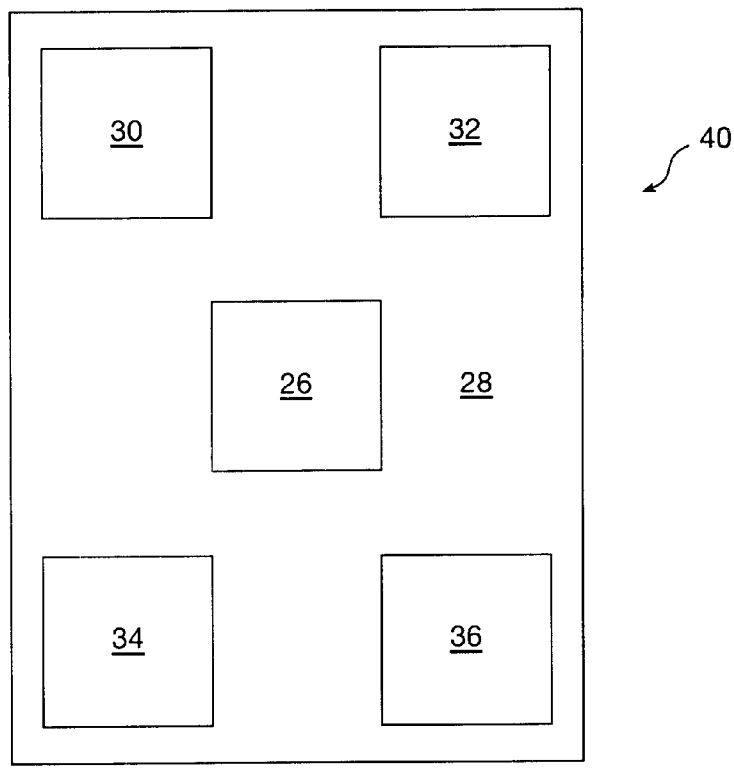
FIG. 2 is a top plan view of a MCM layout in accordance with a specific embodiment of the present invention.

Turning now to FIG. 2, a top plan view of a MCM in accordance with a specific embodiment of the present invention is shown. One or more high value chips 26 such as ASICs, CPUs, DSPs or the like may be located at a position on MCM substrate 28. One or more memory chip packages 30, 32, 34, 36 are also located on MCM substrate 28. High value chip 26 has a large number of electrical connections to make with substrate 28 and is directly attached thereto using flip chip technology with an under fill of, for example, heat curable epoxy. As a result, high value chip 26 cannot be easily removed from substrate 28 once the underfill has cured.

Figure 3:
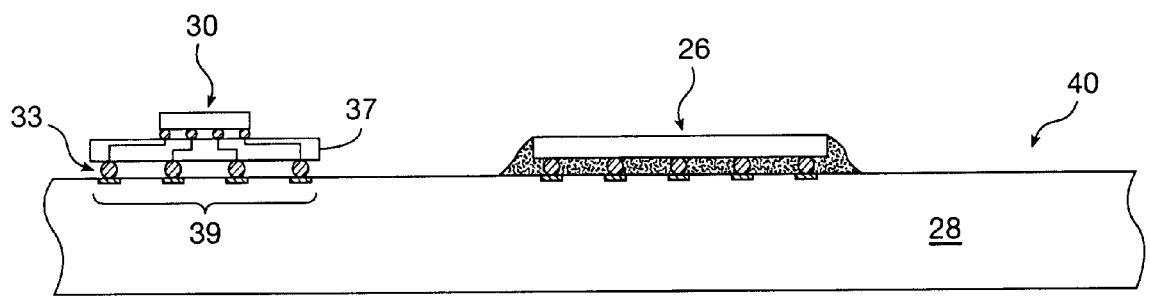
FIG. 3 is a cross-sectional elevational drawing of a Chip Scale Package (CSP) attached to a MCM along with a high value chip in accordance with a specific embodiment of the present invention.

Packaged memory chips 30, 32, 34, 36 are attached using a different attachment technology as shown in FIG. 3, for example. This attachment technology may include Chip Scale Package (CSP) where chips 30, 32, 34, 36 are packaged as CSPs, with a ball grid array of solder ball 38 disposed on the CSP 30 so that they mate with corresponding pads 39 on MCM substrate 28. Intermediate substrate 27 couples memory chips 35 to solder balls 38. No under fill is necessary in this application because the stress induced by the difference in coefficient of thermal expansion (CTE) between the silicon of memory chip 35 and the substrate material of MCM substrate 28 is relieved by intermediate substrate 37, the solder balls attaching intermediate substrate 37 to memory chip 35 and the solder balls attaching intermediate substrate 37 to MCM substrate 28. The packaged memory chips 30, 32, 34, 36 are removable through localized reflow as well known in the art because no underfill is used.

Once MCM 40 is assembled, it can be tested in a conventional manner to assure proper operation of its circuitry. If the testing process uncovers a defect in one of the packaged memory chips 30, 32, 34 or 36, then, because a reworkable technology was used to attach these packaged chips, the defective package may be identified and removed by heating its solder bumps to reflow temperature and lifting it off. The module can then be reworked to receive a new packaged memory chip (cleaned and fluxed), the new packaged memory chip can be installed, and its solder balls reflowed to, once again, complete MCM 40.

It should be noted that while the high value chip(s) are attached using a direct attach flip chip technology using an underfill to compensate for thermal stress, the packaged memory chips are attached using any suitable technology which does not require an underfill. Available technologies include connector-and receptacle-based package, wirebond package, CSP, leaded package, BGA package and FPBGA package.

The thermal stress compensated by the underfill layer is due to the difference in the Coefficient of Thermal Expansion (CTE) between the chip and the substrate. For example, silicon, a common chip material, has a CTE of around 3 whereas typical epoxy glass laminate circuit boards, as may be used for the MCM substrate, have a CTE of around 16 or 17. As the chip and substrate heat up in operation, this differential CTE, particularly as power is cycled on and off, leads to stress induced fatigue in the solder attachments and eventually can result in failure of one or more conductors linking the chip and the substrate.

Leaded connections, CSP connections, BGA connections, and wirebond connections avoid this problem because the connection areas are larger, more flexible and are better able to absorb the stress without premature failure.

Figure 4A:
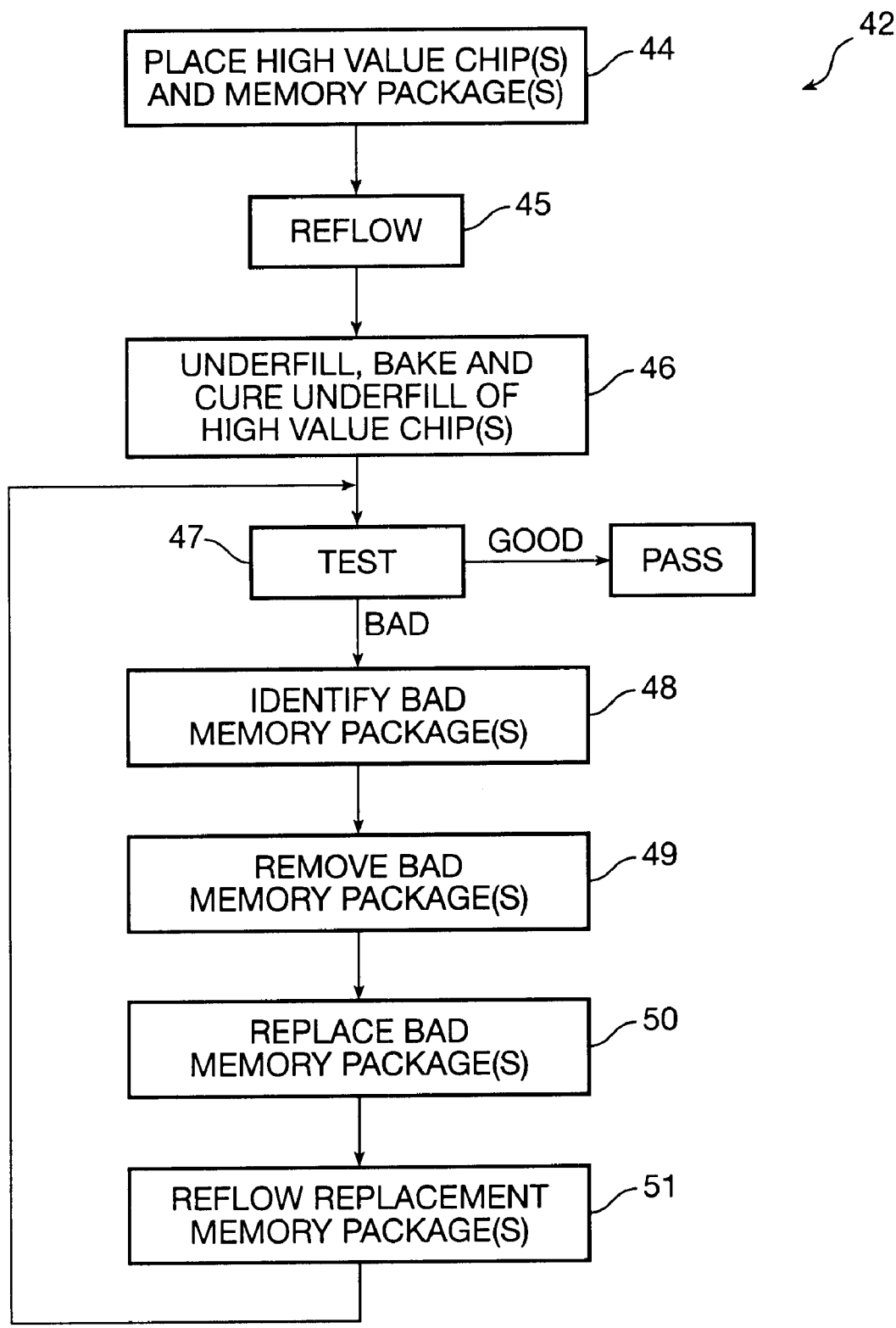
FIGS. 4A and 4B are flow diagrams illustrating processes of MCM fabrication, test and repair in accordance with specific embodiments of the present invention.

Turning now to FIG. 4A a flow diagram 42 illustrates the process associated with the present invention. At block 44 the high value chip(s) and packaged memory are placed on the MCM substrate 28. The MCM substrate 28 is then heated in a reflow oven at block 45, which causes the solder balls or other forms of solder of the various components to reflow making a permanent bond (at least until reflowed again) between the substrate 28 and the chips/packages. At block 46 the high value chip(s) are underfilled with, for example, a heat curable epoxy material so that thermal stresses can be reduced on the solder balls and premature failure averted. The packaged memory chips do not require underfill for the reasons pointed out above. At block 47 the MCM is tested. If it is good, it passes. If not, bad memory is likely the culprit and an attempt (using conventional test equipment and processes) is made at block 48 to identify the bad memory package(s). If such bad packages are identified, then they are removed using conventional spot reflow technology at block 49. At block 50 the substrate is reworked to receive new memory package(s) and the new package(s) are replaced. At block 51 the new package(s) are reflowed using conventional spot reflow technology and a test is attempted again at block 47.

Figure 4B:
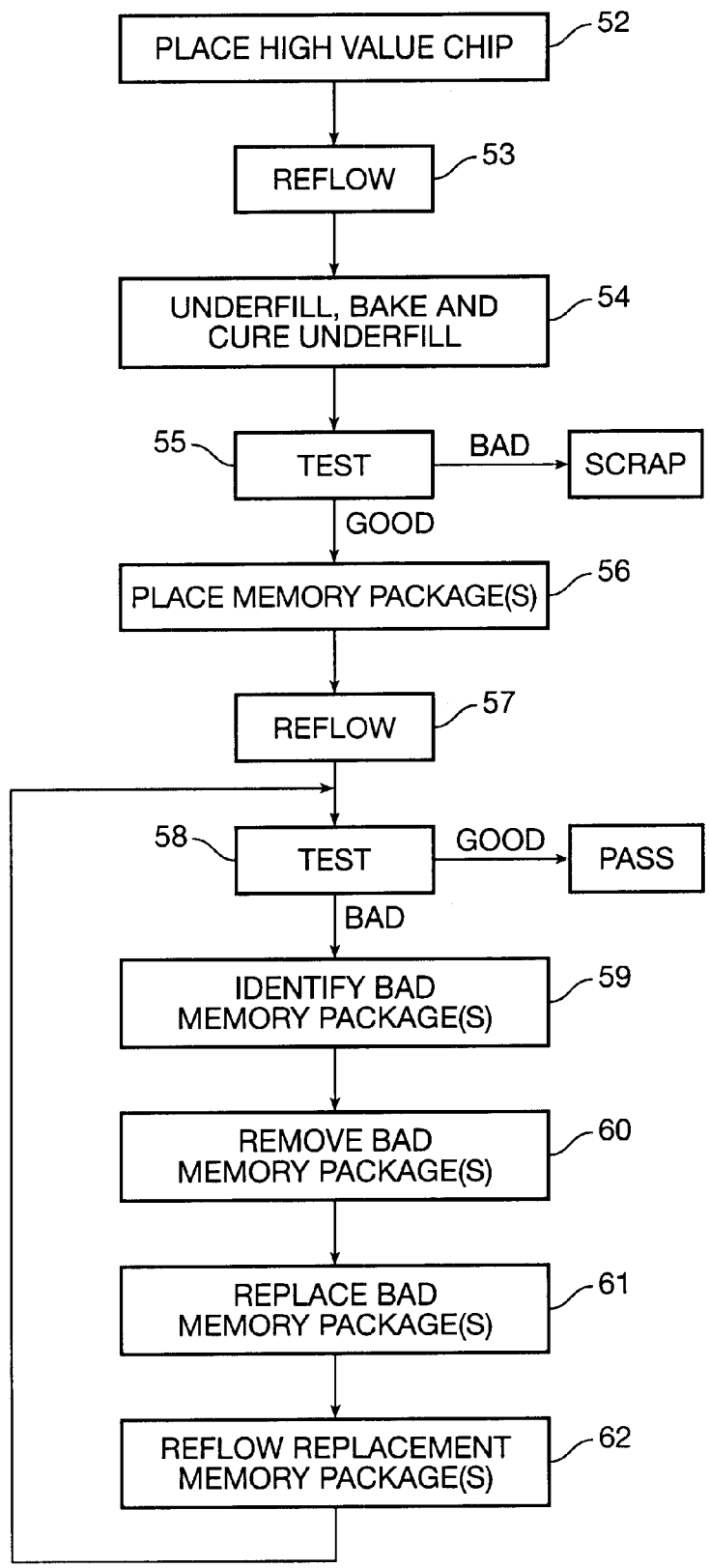

Turning now to FIG. 4B an alternative embodiment of the process shown in FIG. 4A is presented. At block 52 the high value chip(s) are placed on the MCM substrate 28. The MCM substrate 28 is then heated in a reflow oven at block 53. At block 54 underfill is added and heated or baked causing it to cure. At block 55 the partially complete MCM is tested to find any defects in the high value chip(s). If the module fails, it is scrapped. If it passes, memory packages are placed at block 56. They are reflowed at block 57 and the module finally tested at block 58. If it tests good, it is passed. If not, an attempt is made to identify bad memory packages at block 59. If these are identified, they are removed with spot reflow at block 60, the MCM substrate is prepared to receive new package(s) and these are placed at block 61; finally these are reflowed at block 62 and a test is re-performed at block 58.

Figure 5A:
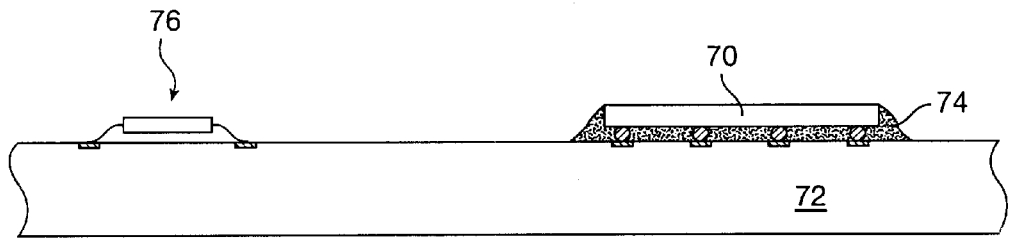
FIG. 5A is a cross-sectional elevational drawing of a specific embodiment of the present invention.

FIG. 5A illustrates a high value chip 70 attached to substrate 72 via flip chip technology with underfill 74 and a memory chip package 76 attached to substrate 72 via a lead-based technology as shown.

Figure 5B:
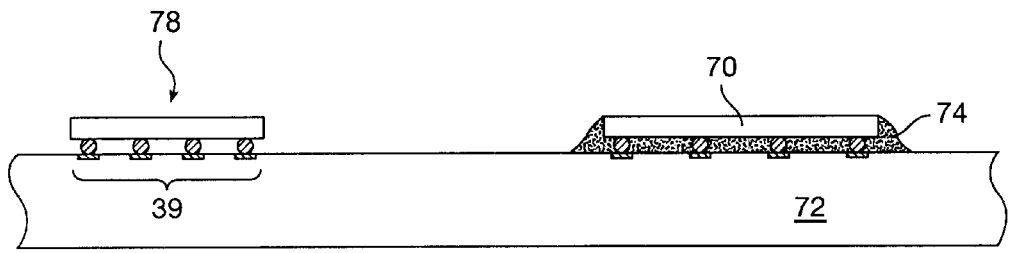
FIG. 5B is a cross-sectional elevational drawing of a specific embodiment of the present invention.

FIG. 5B illustrates a high value chip 70 as in FIG. 5A and a memory chip package 78 attached to substrate 72 via a BGA or FPBGA package as shown.

Figure 5C:
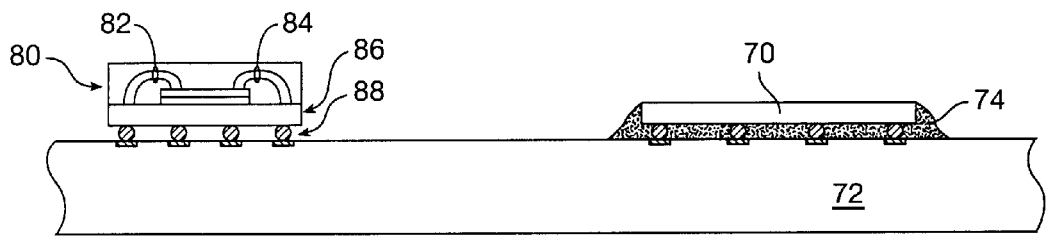
FIG. 5C is a cross-sectional elevational drawing of a specific embodiment of the present invention.

FIG. 5C illustrates a high value chip 70 as in FIG. 5A and a memory chip package 80 attached to substrate 72. Chip package 80 is a wirebond BGA type package as shown including chip 82, wirebond connections 84, intermediate substrate 86, and solder balls 88.

Figure 5D:
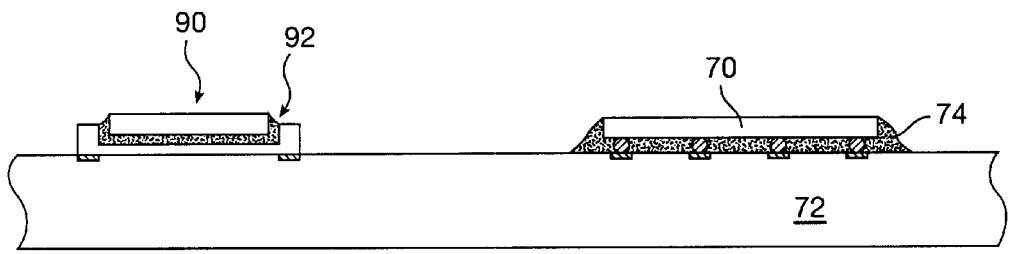
FIG. 5D is a cross-sectional elevational drawing of a specific embodiment of the present invention.

FIG. 5D illustrates a high value chip 70 as in FIG. 5A and a memory chip package 90 attached to substrate 72 via connector receptacle 92. Chip 90 attaches to connector receptacle 92 and connector receptacle 92 is bonded in a conventional manner to substrate 72. With this technology, removal of chip package 90 only requires that it be removed from connector receptacle 92.

Figure 5E:
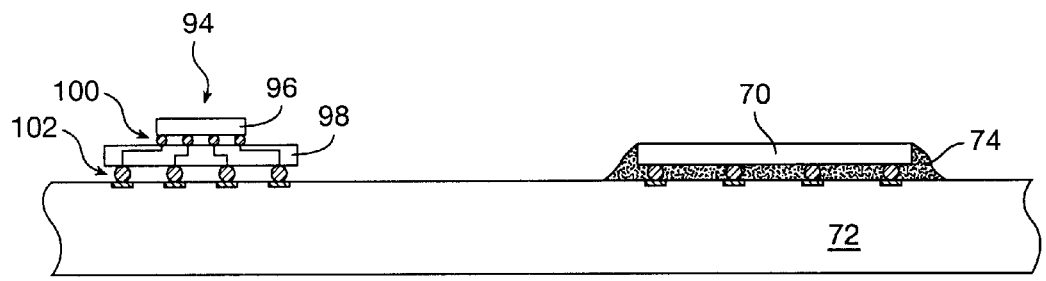
FIG. 5E is a cross-sectional elevational drawing of a specific embodiment of the present invention.

FIG. 5E illustrates a high value chip 70 as in FIG. 5A and a memory chip package 94 of the CSP type. In this case chip 96 is attached to intermediate substrate 98 via flip chip solderballs 100 and intermediate substrate 100 is attached to MCM substrate 72 via BGA or FPBGA solder balls 102. With this technology, removal of package 94 is achieved by reflowing solder balls 102.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for fabricating a multi-chip module (MCM) comprising:
   placing a high value semiconductor chip on a MCM substrate along with a packaged memory chip, said high value semiconductor chip adapted to be directly attached to said MCM substrate and said packaged memory chip adapted to be attached to said MCM substrate using a non-direct attach process;
   reflowing the MCM substrate;
   underfilling the high value semiconductor chip with an underfill material;
   curing the underfill material;
   testing the MCM;
   identifying any bad memory packages;
   removing any bad memory packages;
   replacing any bad memory packages;
   reflowing any replaced memory packages; and
   re-testing the MCM.

2. A method in accordance with claim 1 wherein said packaged memory chip is a wirebond package.

3. A method in accordance with claim 1 wherein said packaged memory chip is a chip scale package (CSP).

4. A method in accordance with claim 1 wherein said packaged memory chip is a leaded package.

5. A method in accordance with claim 1 wherein said packaged memory chip is a ball grid array (BGA) package.

6. A method in accordance with claim 1 wherein said packaged memory chip is a fine pitch ball grid array (FPBGA) package.

7. A method for fabricating a multi-chip module (MCM) comprising:
   placing a high value semiconductor chip on a MCM substrate;
   placing a receptacle for a packaged memory chip on a MCM substrate;
   reflowing the MCM substrate;
   underfilling the high value semiconductor chip with an underfill material;
   curing the underfill material;
   placing a packaged memory chip into said receptacle;
   testing the MCM;
   identifying any bad packaged memory chip;
   removing any bad packaged memory chip;
   replacing any bad packaged memory chip; and
   retesting the MCM.

8. A method for fabricating a multi-chip (MCM) comprising:
   placing a high value semiconductor chip on a MCM substrate;
   reflowing solder between the high value semiconductor chip and the MCM substrate;
   underfilling the high value semiconductor chip with an underfill material;
   curing the underfill material;
   testing the MCM;
   placing a packaged memory chip on the MCM substrate;
   reflowing solder between the package memory chip and the MCM substrate;
   testing the MCM;
   identifying any bad memory packages;
   removing any bad memory packages;
   replacing any bad memory packages;
   reflowing solder disposed between any replaced memory packages and the MCM substrate; and
   retesting the MCM.

9. A method in accordance with claim 8 wherein said packaged memory chip is a wirebond package.

10. A method in accordance with claim 8 wherein said packaged memory chip is a chip scale package (CSP).

11. A method in accordance with claim 8 wherein said packaged memory chip is a leaded package.

12. A method in accordance with claim 8 wherein said packaged memory chip is a ball grid array (BGA) package.

13. A method in accordance with claim 8 wherein said packaged memory chip is a fine pitch ball grid array (FPBGA) package.

14. A method for fabricating a multi-chip module (MCM) comprising:
   placing a high value semiconductor chip on a MCM substrate;
   placing a receptacle for a packaged memory chip on a MCM substrate;
   reflowing the MCM substrate;
   underfilling the high value semiconductor chip with an underfill material;
   curing the underfill material;
   placing a packaged memory chip into said receptacle;
   testing the MCM;
   identifying any bad packaged memory chip;
   removing any bad packaged memory chip;
   replacing any bad packaged memory chip; and
   retesting the MCM.

15. A method for fabricating a multi-chip module (MCM) comprising:
   placing a high value semiconductor chip on a MCM substrate;
   reflowing solder disposed between the high value semiconductor chip and the MCM substrate;
   underfilling the high semiconductor chip with an underfill material;
   curing the underfill material;
   testing the MCM;
   placing a packaged memory chip into a receptacle on the MCM substrate;
   testing the MCM;
   identifying any bad memory packages;
   removing any bad memory packages;
   replacing any bad memory packages; and
   retesting the MCM.

* * * * *